United States Patent [19]

Hinks et al.

[11] Patent Number: 5,126,321
[45] Date of Patent: Jun. 30, 1992

[54] PREPARATION OF BI-SR-CA-CU-O SUPERCONDUCTORS FROM OXIDE-GLASS PRECURSORS

[75] Inventors: David G. Hinks, Lemont, Ill.; Donald W. Capone, II, Northbridge, Mass.

[73] Assignee: The United States of America as represented by the Department of Energy, Washington, D.C.

[21] Appl. No.: 508,549

[22] Filed: Apr. 10, 1990

Related U.S. Application Data

[63] Continuation of Ser. No. 230,196, Aug. 9, 1988, abandoned.

[51] Int. Cl.$^5$ .................. C03C 10/02; C03C 3/12; H01B 1/08
[52] U.S. Cl. ........................ 505/1; 501/10; 501/41; 505/733; 505/782
[58] Field of Search ............... 505/1, 733, 782; 501/10, 41

[56] References Cited

PUBLICATIONS

Komatsu, T. et al.; "High-$T_c$ Superconducting Glass Ceramics Based on the Bi-Ca-Sr-Cu-O System"; Japanese Journal of Applied Physics, vol. 27, No. 4 Apr. 1988, pp. 6550-6552.
Minami, T. et al.; "Glass Formation-of High $T_c$ Compound BiCaSrCu$_2$O$_x$ by Rapid Quenching" Japanese Journal of Applied Physics, vol. 27, No. 6, Jun. 1988, pp. L777-L778.
Inoue, A. et al.; "Production of Bi-Sr-Ca-Cu-O Glasses by Liquid Quenching and Their Glass Transition and Structural Relaxation", Japanese Journal of Applied Physics vol. 27, No. 6, Jun. 1988, pp. 941-943.
Kim, N. et al.; "Preparation, Crystallization & Properties of Rapidly Solidified YBa$_2$ Cu$_3$ O$_{7-8}$"; Materials Letters, vol. 5, No. 10, Sep. 1987, pp. 387-389.
Matsushita, K. et al.; Translation of Japanese Nikkan Kogyo News Mar. 16, 1988, 5 pages.
Bhargara, A. et al. "Crystallization of Ba$_2$YCu$_3$O$_x$ From Glasses in the System BaO-Y$_2$O$_3$-CuO-B$_2$O$_3$"; Extended Abstracts-High-Temperature Superconductors II; Materials Research Society, Apr. 5-9, 1988.

*Primary Examiner*—Mark L. Bell
*Attorney, Agent, or Firm*—James W. Weinberger; Thomas G. Anderson; William R. Moser

[57] ABSTRACT

A superconductor and precursor therefor from oxide mixtures of Ca, Sr, Bi and Cu. Glass precursors quenched to elevated temperatures result in glass free of crystalline precipitates having enhanced mechanical properties. Superconductors are formed from the glass precursors by heating in the presence of oxygen to a temperature below the melting point of the glass.

14 Claims, 4 Drawing Sheets

PREPARATION OF BI-SR-CA-CU-O SUPERCONDUCTORS FROM OXIDE-GLASS PRECURSORS

CONTRACTUAL ORIGIN OF THE INVENTION

This is a continuation of application Ser. No. 230,196 filed Aug. 9, 1988, now abandoned.

This invention was made with Government support under Contract Number W-31-109-ENG-38 awarded by the United States Department of Energy. The Government has certain rights in the invention.

BACKGROUND OF THE INVENTION

This invention relates generally to the fabrication and composition of superconducting material and is particularly directed to the production of a new class of superconductors and superconductor precursors. The precursors of this invention relate to glassy materials which are 100% dense and can be converted to superconductors having a vastly superior density, not heretofore available. These superconductors have large current densities and also permit fabrication of superconductors in a variety of physical shapes.

This invention relates generally to the fabrication and composition of superconducting materials and is particularly directed to the production of very dense superconducting material and of glass precursors. New shapes are also possible with the invention.

Certain metals, alloys, and chemical compounds known as superconductors exhibit zero electrical resistivity and complete diamagnetism at very low temperatures and magnetic fields. The transition of a metal from normal electrical conducting properties to superconducting properties depends primarily on (1) the temperature and (2) the magnetic field at the surfaced of the metal. The superconductive state of the metal exists for temperatures less than its characteristic critical temperature, $T_c$. The most practical superconducting materials exhibit very low critical temperatures, i.e., on the order of 4°-23° K. However, recent developments have produced new superconducting materials, based on oxides, having critical temperatures on the order of 100° K.

Superconductors also exhibit a characteristic critical electric current density, $J_c$, measured in amps/cm$^2$. By increasing the current density in a superconducting material to its $J_c$ characteristic value, it can be driven into a normal conducting state. Thus, the current density at which this transition occurs is termed the conductive material s critical current density. It is of course desirable for a superconductor to have a high critical current density to allow it to conduct large currents while remaining superconductive.

Since the report of superconductivity above 30° K in a multiphase La-Ba-Cu-O system, a great deal of activity has centered on the isolation of superconducting phases, the determination of their structures, and the search for other high temperature superconductors. Until recently, there were only two oxide structure-types which demonstrated this high-$T_c$ behavior, the tetragonal form of La$_{2-x}$M$_x$CuO$_4$ (M=Ca,Sr,Ba) and the YBa$_2$Cu$_3$O$_x$ distorted perovsite. Superconductivity in the Bi-Sr-Cu-O system was first reported for Sr$_2$Bi$_2$-Cu$_2$O$_{7+\delta}$, where T's in the range 7K to 22K were observed, but the structure of the single phase material remains unknown. The production of Bi, Sr, Ca, Cu$_2$, O$_x$ superconductors with onset of 80° K or 105° K has proven difficult. The phase responsible for the lower $T_c$ (about 80° K) can be synthesized over wide cation starting compositions, although obtaining the 110K transition has been a problem. Essentially identical x-ray powder patterns are produced from different metal-ion starting ratios. There are now several reports claiming different single phase materials as responsible for superconductivity in the Ca-Sr, Bi-Cu-O system.

The standard method of sample preparation is to form intimate mixtures of the constituent binary oxides and carbonates. Historically, this route is chosen because of previous difficulties in synthesizing YBa$_2$Cu$_3$O$_x$ ("123") using alternate techniques. For example, heating the "123" samples above their melting points (approx. 1030° C.) results in multiphase samples which are not superconducting. Samples in the Bi-Sr-Ca-Cu-O system, when produced by powder processing, are low density and suffer from lack of sintering. SEM photographs of crystallites of the superconducting phase clearly demonstrate their plate-like morphology. This feature, combined with the very low packing density of these plates (about 40%) suggests that powder methods may be very inefficient as a synthetic route.

We have synthesized these new phases from amorphous glasses which are produced by quenching melts of the constituent oxides, followed by firing to produce the superconducting phase. This method can produce 100% dense starting materials which eliminates the problem of long range diffusion during synthesis. This technique may permit the synthesis of pure materials with enhanced bulk properties, such as optimal critical currents.

The invention consists of certain novel features and a combination of parts hereinafter fully described, illustrated in the accompanying drawings, and particularly pointed out in the appended claims, it being understood that various changes in the details may be made without departing from the spirit, or sacrificing any of the advantages of the present invention.

DESCRIPTION OF THE PREFERRED EMBODIMENT

Amorphous precursors have been prepared in the Bi-Sr-Ca-Cu-O system by splat quenching of the molten oxide materials. These glassy materials are subsequently heat treated to crystallize the glass and to synthesize the Bi-Sr-Ca-Cu-O superconductor. Glasses have prepared over a wide cation composition range, see Table I, encompassing all of the speculated compositions for the single phase responsible for superconductivity in this system. Starting materials of $Bi_2O_3$, $SrCO_3$, $CaCO_3$, and CuO were wet ball milled in the desired ratio using an agate container. The mixed materials were then calcined for several hours in air at 830° C. to decompose the carbonates and to prereact the starting materials. The calcined material was then melted in air using a platinum crucible. This molten mixture was then splat quenched onto copper surfaces to form the glassy precursors. Reactions with both the platinum crucible and the copper surfaces were negligible. The samples quenched onto room temperature copper plates had poor mechanical integrity, shattering into small pieces during the quenching process. By increasing the surface temperature of the copper blocks slightly (to approximately 200° C.) the mechanical integrity of the glass is greatly improved. Quenching to elevated temperatures of from about 100° C. to under the melting point of the glass should provide improved mechanical properties. 200° C. appears to be an optimum temperature. Single pieces, several square centimeters in diameter have a thickness of <0.3 mm, have been produced using this technique; however, in general thickness from about 10 to about 100 microns are easily produced by this method. Scanning electron microscopy (SEM) show the presence of small crystalline precipitates in glasses quenched to room temperature. These small crystalline precipitates are completely absent in the samples quenched to 200° C.

The crystallization of the glass and the subsequent reaction to form the superconducting materials have been studied by x-ray diffraction, obtained from a Scintag PAD V diffractometer utilizing Cu-$K_\alpha$ radiation. Differential thermal analyses (DTA) were obtained with a Perkin-Elmer System 7/4 using Al and Ag as temperature calibrants. Microstructures of the samples were examined using a JEOL JSM 840A scanning electron microscope. Electrical properties have been studied by standard 4-probe d.c. resistivity measurements, using 1-10 mA/cm$^2$ in the 8.5-320° K range utilizing a computer-controlled closed-cycle refrigerator. Temperatures were measured using SiO diode thermometry and are accurate to about 0.5° K over the measured temperature range.

Figure 1:
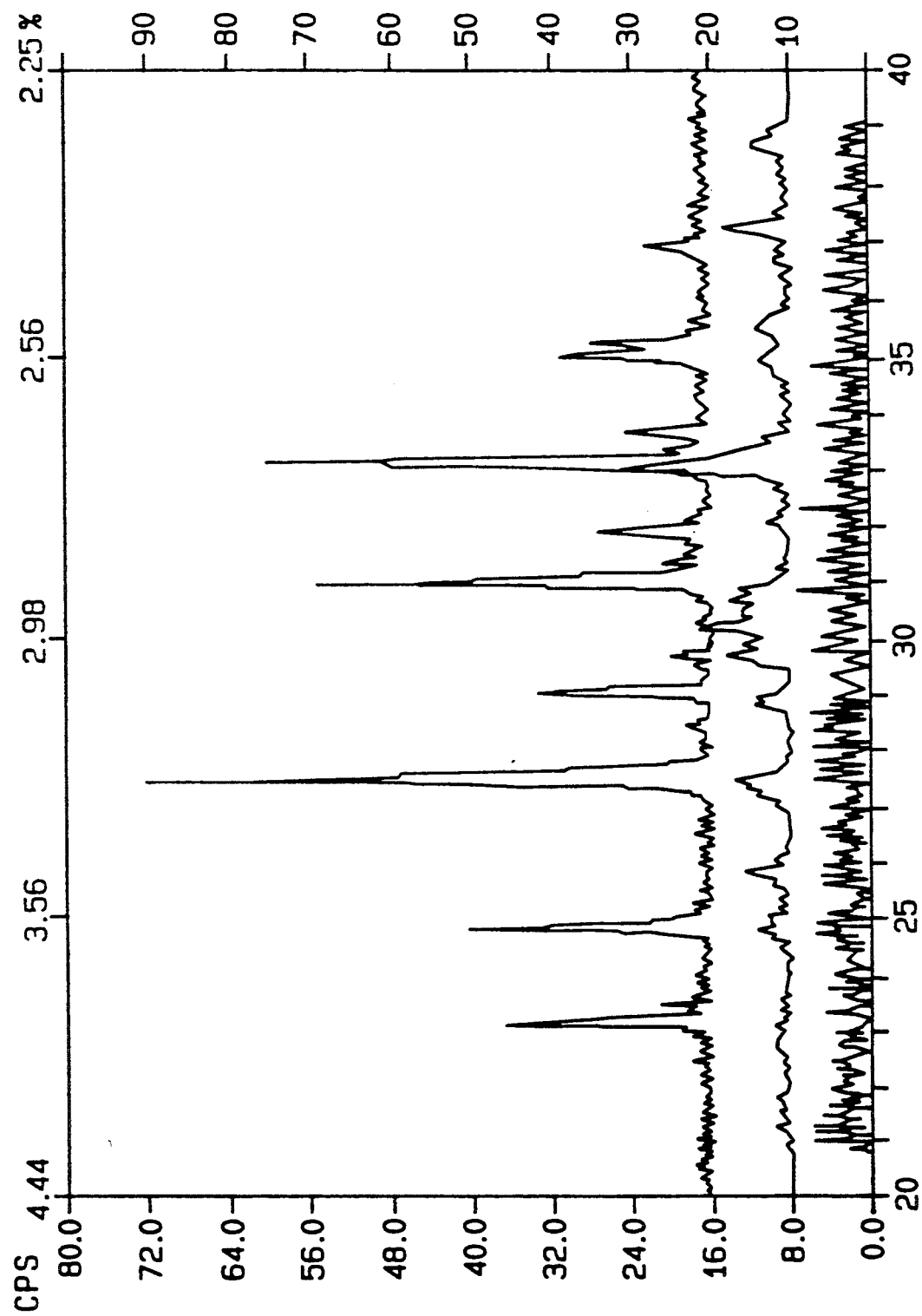
FIG. 1 is a graph showing X-ray diffraction patterns of (bottom) the preannealed glass, (middle) after annealing the glass in oxygen at 640° C., and (top) after annealing the glass at 830° C.
Figure 2:
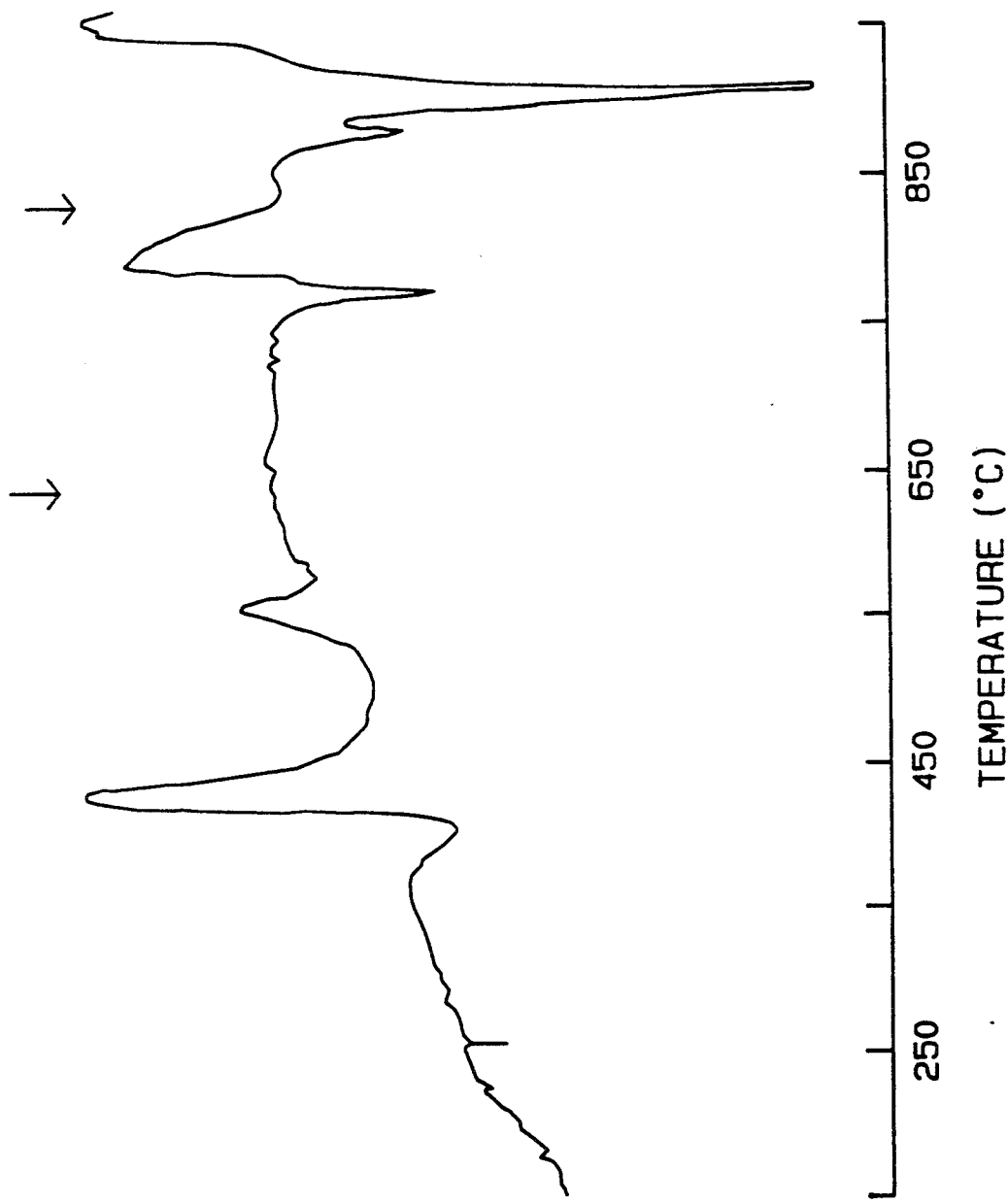
FIG. 2 is a graph showing a DTA scan obtained on the 2:2:2:3 composition at a heat rate of 10° C./min. in an oxygen atmosphere.

All data presented herein were obtained on materials synthesized using the same metal-ion starting composition (i.e. a Bi:Sr:Ca:Cu stoichiometry of 2:2:2:3), but the invention is not so limited; rather the atom ratios are $Ca_{1-2}$, $Sr_{0.5-2}$, $Bi_{1-4}$, $Cu_{1-4}$, $O_x$. The x-ray diffraction pattern for this composition in the as-quenched state (200° C. quench temperature) is shown as the lower pattern in FIG. 1. The material is completely amorphous, with the diffraction pattern showing the complete lack of diffraction peaks in the range 20°<2θ<40°. A differential thermal analysis (DTA) scan for this sample is shown in FIG. 2. The initial crystallization of the glass occurs at a temperature around 450° C., as evidenced by the exotherm at that temperature in the DTA scan. This sample has a second exotherm at a temperature near 570° C. An X-ray diffraction pattern for a sample annealed at 650° C. is shown as the middle curve in FIG. 1, where some poorly defined crystalline peaks are illustrated. $CaCu_2O_3$, CuO and $BiCaSrO_x$ are crystalline phases present at 650° C., and therefore this is not a polymorphous crystallization process. At higher temperatures, a complicated series of endo- and exotherms is observed just prior to the melting. The features disclosed near 800° C. indicate the formation of the superconducting phase since only in samples annealed above this temperature is superconductivity observed.

Although the details of the structure in the DTA scan are different for different compositions and gas environments, most of the samples made have some superconducting fraction present upon annealing at 830° C. in either air or flowing $O_2$. Heating to higher temperatures results in sample melting, evidenced here by the large endotherm near 900° C. The DTA cooing curve after melting shows that this material undergoes incongruent melting as several exotherms are noted in the temperature range where the initial melting takes place. Furthermore, x-ray analyses show no evidence of the superconducting phase remaining in resolidified melts. This behavior is not uncommon for complex oxide systems.

Figure 3A:
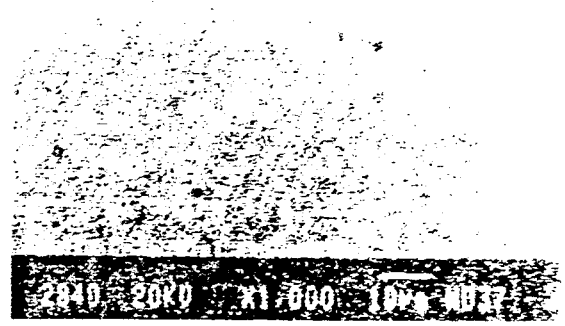
FIG. 3(a) is a scanning electron micrograph (SEM) of an as-quenched glass (with a quenching temperature of 200° C.)
Figure 3B:
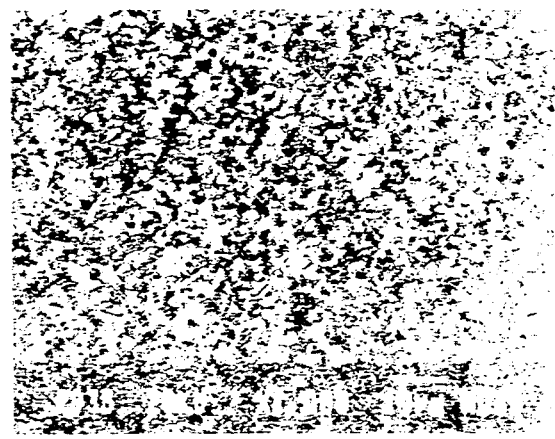
FIG. 3(b) is a SEM of the superconducting product made from annealing the glass at 830° C. for several hours.
Figure 3C:
FIG. 3(c) is a SEM of a sample prepared from intimately mixing oxide powders.

FIG. 3A is an SEM photo of the initial glass material demonstrating the complete lack of crystalline phases compared to the crystallized material annealed at 830° C. for 12 hours. The initial glass phase is 100% dense with no noticeable voids present. After annealing this glass at about 830° C. (FIG. 3b), the morphology appears plate-like, but the sample is much denser than similar samples made from grinding oxides and firing, see for example, FIG. 3c of a sample synthesized by standard powder techniques. For definitional purposes, the crystalline superconductor made from a 100% dense glass precursor is termed "substantially 100% dense". It is also important during the annealing phase to raise the temperature at a slow enough rate to prevent any of the glass from melting.

Figure 4:
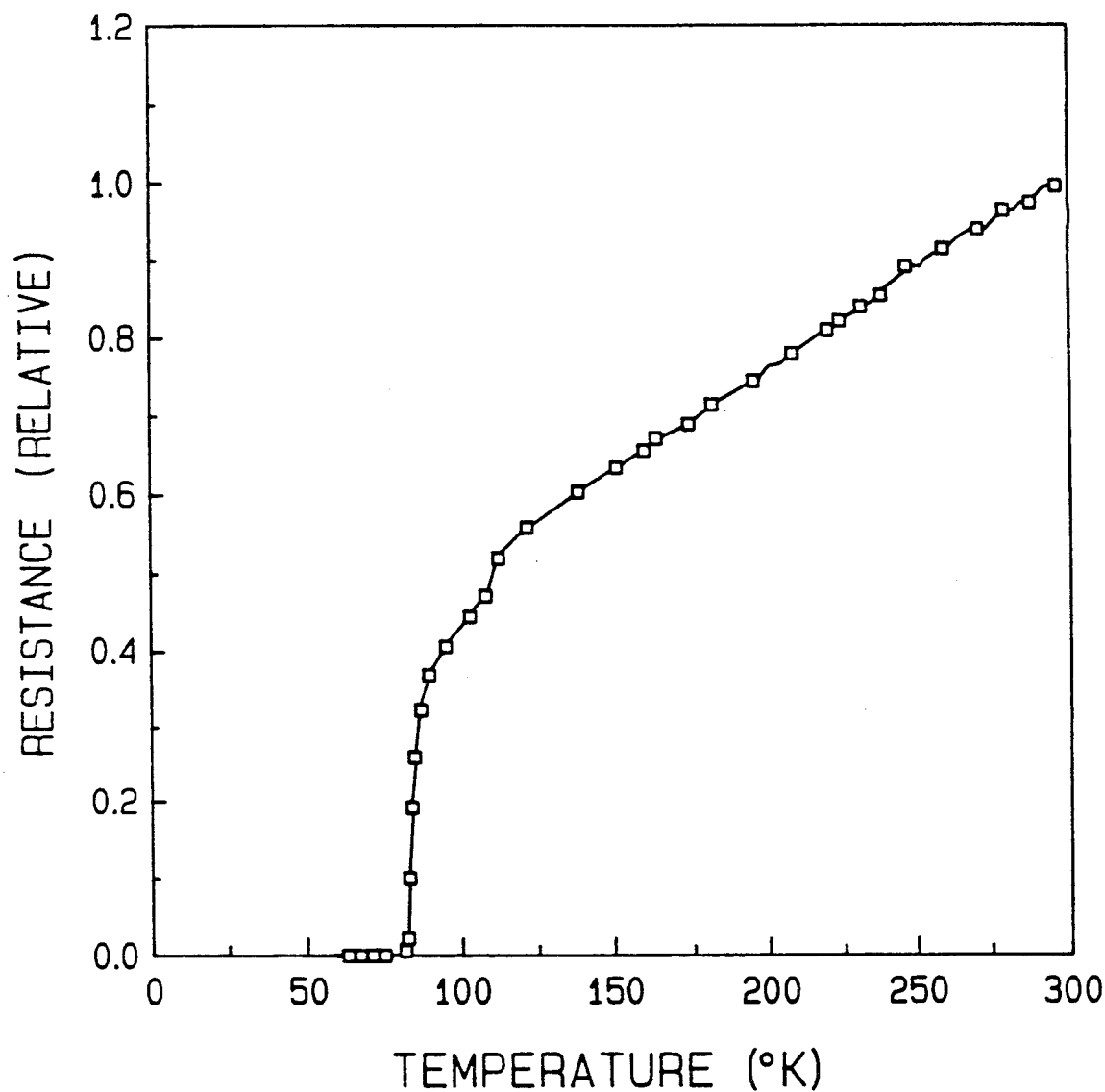
FIG. 4 is a graph showing the normalized resistance vs. temperature for a sample with the 2:2:2:3 composition.

FIG. 4 shows a normalized resistance vs. temperature relationship for a sample with the 2:2:2:3 composition. There were two superconducting phases in the sample, one with a $T_c$ at about 110° K and the other with a $T_c$ of about 85° K. There was only a small amount of the higher $T_c$ phase, since there was only a very small resistive transition, accompanied by a small diamagnetic transition of 110° K. Very similar results were obtained throughout the composition space examined, although not all compositions showed evidence for the 110° K transition.

This invention has provided oxide glass precursors over a wide compositional range in the Hi-Sr-Ca-Cu-O system which can be treated to both crystallize the glass and synthesize the superconducting material. These glass precursors are 100% dense, have good mechanical integrity and possess high fracture strength. The ability to produce 100% dense glasses enables various rapid solidification techniques such as melt spinning, splat quenching, e-beam and laser annealing to be employed for the fabrication of superconducting wires and/or tapes in this system. In addition, the increased densification and homogeneity achieved in samples prepared using this technique should increase the transport critical current densities over those attainable in conventionally prepared materials.

Both superconducting tapes and flat sheets have been produced with significantly superior bulk densities compared to the previous best results starting from oxide powders.

As seen therefore, a glass-ceramic superconductor has been disclosed which is formed by the process of providing a mixture of metal oxides forming a glass from the metal oxides and thereafter heating the glass in the presence of oxygen to a temperature not less than about 800° C. for a time sufficient to form a superconductor. The superconductor so formed has been shaped into a flat sheet, a ribbon, a thin sheet and a tape. Particularly, the glass-ceramic superconductor formed from a mixture of metal oxides is most advantageously formed by heating the metal oxides to form a glass and thereafter rapidly cooling the glass to a temperature above ambient temperature and less than about 500° C. and preferably to a temperature not less than between about 100° C. and about 200° C. to provide a substantially 100% dense glass which may thereafter be converted to a superconductor by annealing in the presence of oxygen at a temperature not less than about 800°. Such a glass precursor of a superconducting crystalline ceramic is free of crystalline precipitates and is converted to the superconductor by annealing in the presence of oxygen preferably at a temperature between about 820° C. to a temperature less than the melting point of the glass but in any event less than about 900° C.

While particular embodiments of the present invention have been shown and described, it will be obvious to those skilled in the art that changes and modifications may be made without departing from the invention in its broader aspects.

We claim:

1. A shaped glass-ceramic superconductor formed by the process of providing a mixture of metal oxides of calcium, strontium, bismuth and copper, said metal oxides being present in atom concentrations of $Ca_{0-2}$, $Sr_{0.5-2}$, $Bi_{1-4}$ and $Cu_{1-4}$, forming a substantially 100% dense glass from the metal oxides, forming the glass into a shape, said shape having a thickness in the range of from about 10 microns to about 100 microns, and heating said glass in the presence of oxygen to a temperature not less than about 800° C. and for a time sufficient to form a shaped superconductor.

2. The glass-ceramic superconductor of claim 1, wherein the glass-ceramic is self supporting exclusive of a substrate.

3. A superconductor formed by the process of providing a mixture of metal oxides of Ca, Sr, Bi and Cu, said metal oxides being present in atom concentrations of $Ca_{0-2}$, $Sr_{0.5-2}$, $Bi_{1-4}$, and $Cu_{1-4}$, heating said metal oxides to form a glass, rapidly cooling the glass to a temperature not less than about 100° C. to provide a substantially 100% dense glass, forming the dense glass into a shape, converting the shape of glass into a superconductor by annealing in the presence of oxygen at a temperature not less than about 800° C.

4. The superconductor of claim 3, wherein the shape is a ribbon.

5. The superconductor of claim 3, wherein the shape is a thin sheet.

6. The superconductor of claim 3, wherein the sheet has a thickness of from about 10 microns to 100 microns.

7. The superconductor of claim 3, wherein the glass is rapidly cooled to a temperature o about 200° C. by splat cooling.

8. A substantially 100% dense shaped glass-ceramic superconductor comprising a combination of metal oxides wherein the metal oxides are selected from the group consisting of Ca, Sr, Bi and Cu and the metal ions are in ratios in the range of $Ca_{0-2}$, $Sr_{0.5-2}$, $Bi_{1-4}$, and $Cu_{1-4}$.

9. A shaped glass precursor of a superconductor glass-ceramic wherein said glass precursor is free of crystalline precipitants, is 100% dense and is a mixture of metal oxides selected from Ca, Sr, Bi and Cu and wherein said metal oxides are present in atom ratios of $Ca_{0-2}$, $Sr_{0.5-2}$, $Bi_{1-4}$, and $Cu_{1-4}$.

10. A method of forming a superconductor comprising providing a metal oxide mixture selected from the oxides of calcium, strontium, bimuth, and copper, wherein the atom ratios of the oxides are $Ca_{0-2}$, $Sr_{0.5-2}$, $Bi_{1-4}$ and $Cu_{1-4}$, forming a glass from the oxide mixture, rapidly cooling the glass to a temperature in the range from about 100° C. to about 200° C., shaping the glass and heating the glass in the presence of oxygen to a temperature less than the melting point of the glass to convert the glass to a crystalline superconductor.

11. The method of claim 10, wherein the glass is rapidly cooled to a temperature of about 200° C.

12. The method of claim 10, wherein the glass is heated to a temperature in the range of from about 820° C. to less than about 900° C. to convert the glass to a superconductor.

13. The method of claim 10, wherein the glass is heated in the presence of oxygen at a rate to prevent melting thereof.

14. A method of forming a superconductor, comprising providing an oxide mixture of Ca, Sr, Bi and Cu wherein said metal ions are present in atom ratios in the range of $Ca_{0-2}$, $Sr_{0.5-2}$, $Bi_{1-4}$, $Cu_{1-4}$, forming a glass from the oxide mixture, rapidly cooling the glass to an elevated temperature above ambient temperature and less than about 500° C. to form a glass free of crystalline precipitates, and heating the glass in the presence of oxygen at a temperature above that 820° C. to less than the melting point thereof at a rate to prevent melting of the glass for a time sufficient to form a glass-ceramic with a superconducting phase.

* * * * *